US011626350B2

(12) United States Patent
Lim et al.

(10) Patent No.: US 11,626,350 B2
(45) Date of Patent: Apr. 11, 2023

(54) CUTTING A LEADFRAME ASSEMBLY WITH A PLURALITY OF PUNCHING TOOLS

(71) Applicant: TEXAS INSTRUMENTS INCORPORATED, Dallas, TX (US)

(72) Inventors: Chong Han Lim, Kuala Lumpur (MY); Lee Han Meng@Eugene Lee, Muar (MY); Anis Fauzi Bin Abdul Aziz, Yan (MY); Wei Fen Sueann Lim, Melaka (MY); Siew Kee Lee, Jalan Kodiang (MY)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 69 days.

(21) Appl. No.: 16/839,216

(22) Filed: Apr. 3, 2020

(65) Prior Publication Data

US 2021/0202356 A1 Jul. 1, 2021

Related U.S. Application Data

(60) Provisional application No. 62/954,733, filed on Dec. 30, 2019.

(51) Int. Cl.
*H01L 23/495* (2006.01)
*H01L 21/56* (2006.01)
(Continued)

(52) U.S. Cl.
CPC ...... *H01L 23/49517* (2013.01); *H01L 21/561* (2013.01); *H01L 21/565* (2013.01); *H01L 21/78* (2013.01); *H01L 23/3107* (2013.01); *H01L 23/3114* (2013.01); *H01L 23/4951* (2013.01); *H01L 23/49541* (2013.01); (Continued)

(58) Field of Classification Search
CPC ......... H01L 2924/181; H01L 23/49517; H01L 23/49575; H01L 23/3114; H01L 23/4951; H01L 23/49541; H01L 23/3107; H01L 21/56; H01L 21/78; H01L 23/49548; H01L 21/561; H01L 25/0753; H01L 2224/97
See application file for complete search history.

(56) References Cited

U.S. PATENT DOCUMENTS 6,020,218 A * 2/2000 Shim ................. H01L 24/97
438/111
2005/0287715 A1* 12/2005 Lum .................. H01L 21/565
438/127
(Continued)

*Primary Examiner* — Alonzo Chambliss
(74) *Attorney, Agent, or Firm* — Dawn Jos; Frank D. Cimino

(57) ABSTRACT

A method includes forming a leadframe assembly to have a pair of opposing sides, and having semiconductor die receiving portions extending between the opposing sides. The method also includes placing semiconductor dies on the leadframe assembly in the die receiving portions. Each die has a row of leads on each of two opposing sides of the die and a longitudinal axis parallel to the rows of leads. The longitudinal axis of each die is orthogonal to the opposing sides of the leadframe assembly. The method further includes applying mold compound to the semiconductor dies. The method includes punching through the leadframe assembly between the opposing sides using a first tool having a first tool longitudinal axis parallel to longitudinal axes of the dies.

9 Claims, 12 Drawing Sheets

(51) Int. Cl.
  *H01L 21/78*   (2006.01)
  *H01L 23/31*   (2006.01)
  *H01L 21/00*   (2006.01)
  *H01L 25/075*  (2006.01)
  *H01L 21/60*   (2006.01)

(52) U.S. Cl.
  CPC .. *H01L 23/49548* (2013.01); *H01L 23/49575* (2013.01); *H01L 25/0753* (2013.01); *H01L 2021/6027* (2013.01); *H01L 2224/97* (2013.01); *H01L 2924/181* (2013.01)

(56) References Cited

U.S. PATENT DOCUMENTS

| | | | |
|---|---|---|---|
| 2006/0273433 A1* | 12/2006 | Itou | H01L 21/4828 |
| | | | 257/666 |
| 2007/0164405 A1* | 7/2007 | Abbott | H01L 21/4842 |
| | | | 257/666 |
| 2008/0023806 A1* | 1/2008 | Huat | H01L 21/561 |
| | | | 257/669 |
| 2011/0140253 A1* | 6/2011 | Lee | H01L 24/97 |
| | | | 257/676 |
| 2015/0014831 A1* | 1/2015 | Chan | H01L 23/49551 |
| | | | 257/670 |
| 2015/0228563 A1* | 8/2015 | Eugene Lee et al. | |
| | | | H01L 23/49582 |
| | | | 174/255 |
| 2016/0064298 A1* | 3/2016 | Teh | H01L 23/3142 |
| | | | 257/676 |

* cited by examiner

CUTTING A LEADFRAME ASSEMBLY WITH A PLURALITY OF PUNCHING TOOLS

CROSS-REFERENCE TO RELATED APPLICATION

This application claims priority to U.S. Provisional Application No. 62/954,733, filed Dec. 30, 2019, which is hereby incorporated by reference.

BACKGROUND

One conventional manner to fabricate semiconductor packages (chips) include placing multiple semiconductor dies on a leadframe assembly. A molding operation is performed to encapsulate each die attached to an area of the leadframe assembly. A singulation process is then performed to separate adjacent devices during which dam bars of the leadframe assembly also are cut off to separate adjacent leads. A set of tools is used during singulation and lead forming processes. Such tools are specific to the number of leads of the dies on the leadframe. That is, a different set of tools is used for a lead frame on which 8-pin dies are provided than is used for 14-pin (or other pin count) dies. Each set of tooling is expensive. Further, changing the tooling to switch the production line between different pin count dies is time-consuming.

SUMMARY

In one example, a leadframe assembly includes a first side, a second side opposite the first side, a first set of die attachment portions extending between the first and second sides, and a second set of die attachment portions extending between the first and second sides and parallel to the first set of die attachment portions. Each die attachment portion of the first and second sets includes a first plurality of leads on a first side of the die attachment portion and a second plurality of leads on a second side of the die attachment portion opposite the first side. The leads extend parallel to the first and second sides. The first plurality of leads on the first side of each die receiving portion includes a pair of end leads on either end of the die attachment portion, and the second plurality of leads on the second side of each die attachment portion also includes a pair of end leads on either end of the die attachment portion. Adjacent leads of the first side of each die attachment portion are spaced a first distance apart. Within each of the first and second sets, an end lead of any given die attachment portion and an end lead of an adjacent die attachment portion are also spaced the first distance apart.

In another example, a method includes forming a leadframe assembly to have a pair of opposing sides, and having semiconductor die attachment portions extending between the opposing sides. The method also includes placing semiconductor dies on the leadframe assembly in the die attachment portions. Each die has a row of leads on each of two opposing sides of the die and a longitudinal axis parallel to the rows of leads. The longitudinal axis of each die is orthogonal to the opposing sides of the leadframe assembly. The method further includes applying mold compound to the semiconductor dies. The method includes punching through the leadframe assembly between the opposing sides using a first tool having a first tool longitudinal axis parallel to longitudinal axes of the dies.

In yet another example, a semiconductor package includes a semiconductor die having leads on opposing sides of the semiconductor die and mold compound encapsulating the semiconductor. The mold compound has a top surface, a first pair of sides from which the leads extend, and a second pair of sides orthogonal to the first pair of side. The angle between the top surface and the second pair of side is less than 90 degrees. The angle between the top surface and the second pair of sides is 90 degrees.

BRIEF DESCRIPTION OF THE DRAWINGS

For a detailed description of various examples, reference will now be made to the accompanying drawings in which.

DETAILED DESCRIPTION

Figure 1:
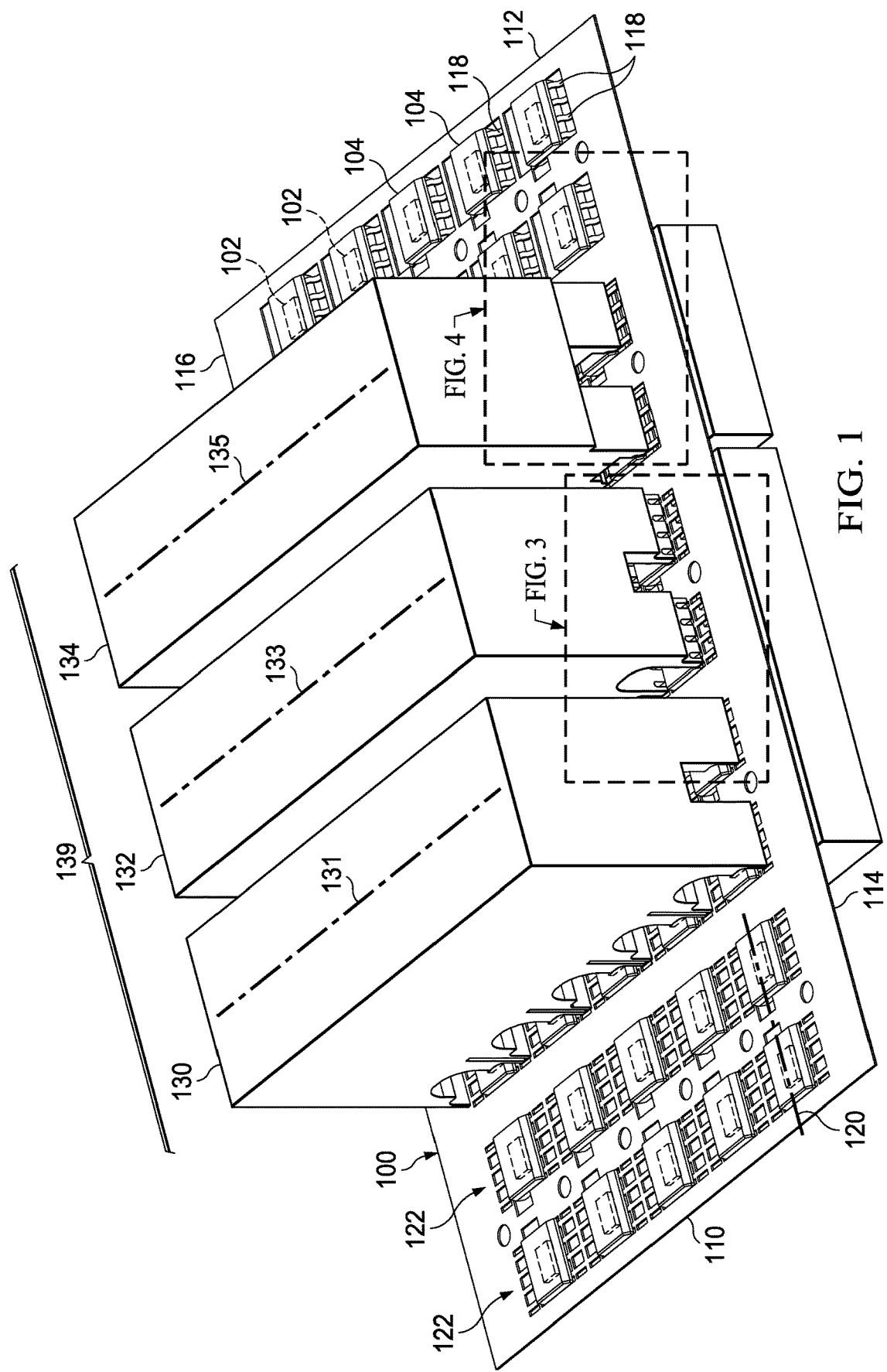
FIG. 1 illustrates an example of leadframe assembly with a tool set specific to that particular leadframe assembly.

FIG. 1 illustrates an example of a leadframe assembly 100 on which multiple semiconductor dies 102 are mounted and encapsulated with mold compound 104. The leadframe assembly is made from a conductive metal (e.g., copper). The leadframe in this example has four sides 110, 112, 114, and 116. Sides 110 and 112 are opposite each other, and sides 114 and 116 are opposite each other. In this example, each die 102 is an 8-pin die with four leads 118 on each of two opposing sides of the die. Each die 102 has a longitudinal axis 120 that extends through the die between the opposing rows of leads 118. For dies 102 that are rectangular with one side being longer than the other, the longitudinal axis 120 runs through the die parallel to the longer side of the die.

Figure 2:
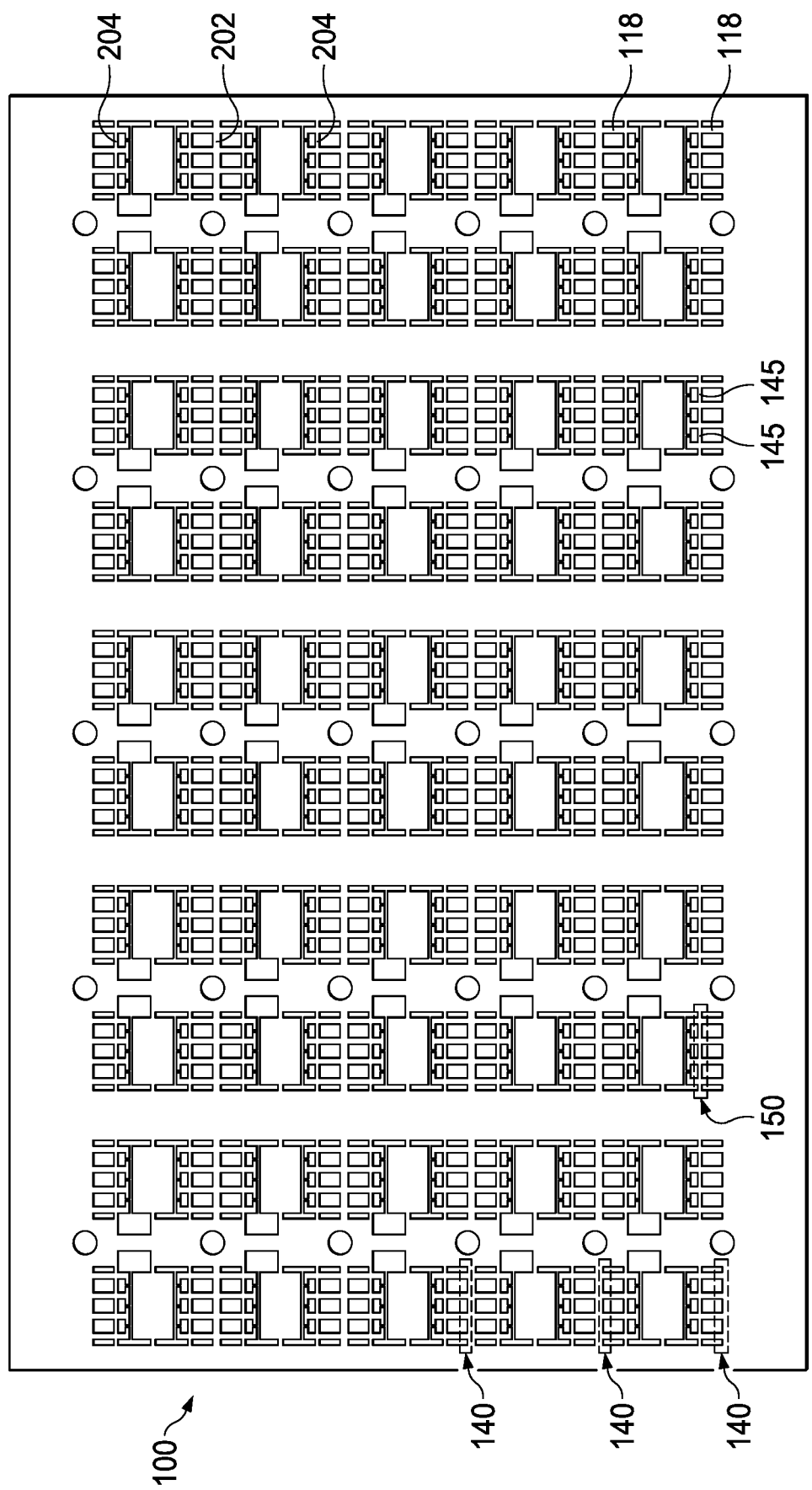
FIG. 2 shows a top-down view of the leadframe assembly of FIG. 1.

The dies 102 in the example of FIG. 1 are arranged in 10 rows 122. Each row has five dies 102 in in this example. FIG. 2 illustrates the leadframe assembly 100 without the dies 102 and mold compound 104. Initially, the leads 118 of each die are connected together by way of dam bars 202 and 204. After the dies 102 are placed on the leadframe 100 (e.g., by a pick and place operation) and covered in mold compound 104, tools 130, 132, and 134 (FIG. 1) are used to punch through the dam bars 202 and 204 to separate and bend the leads 118 into the desired shape.

Figure 3:
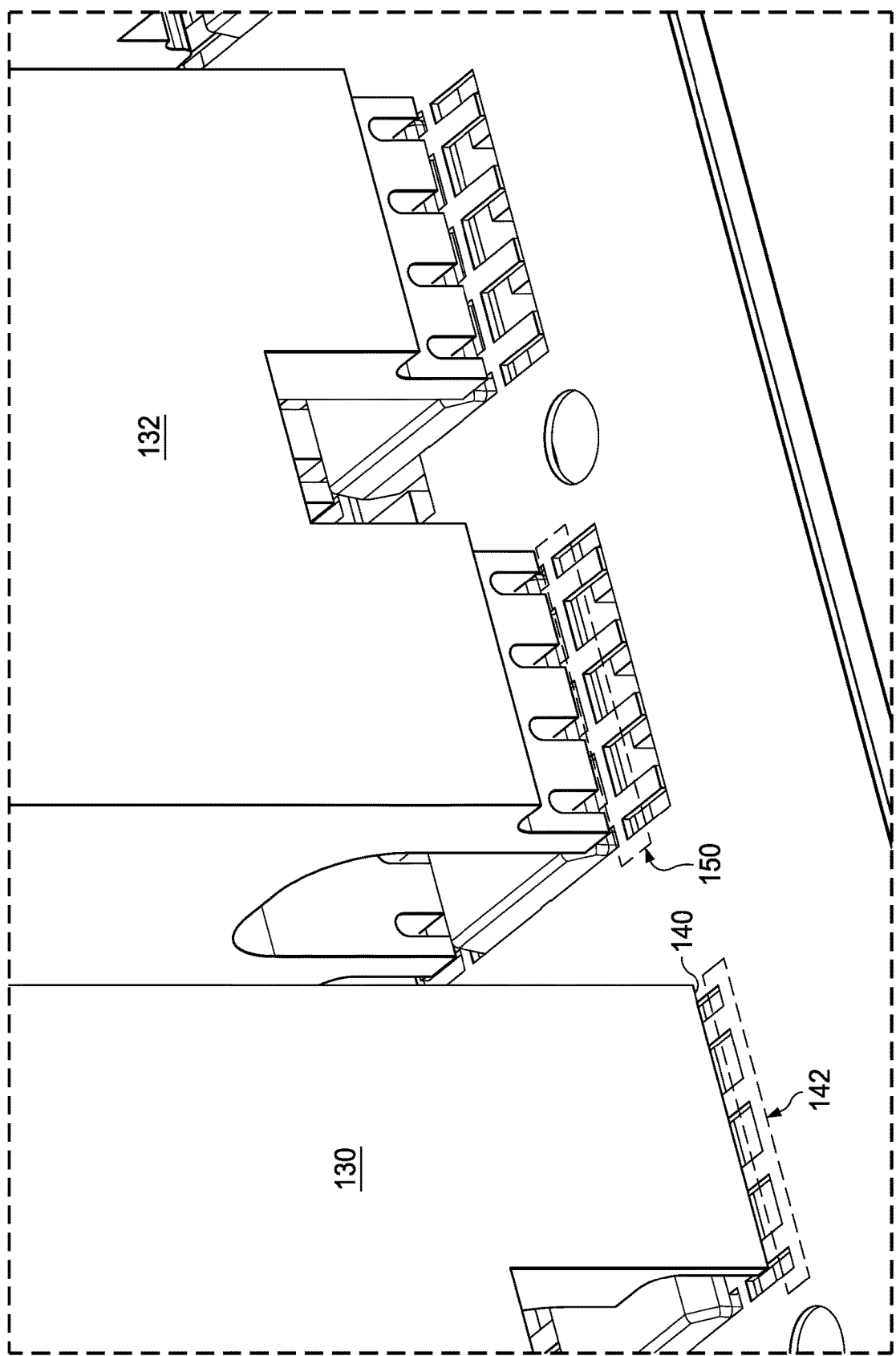
FIG. 3 shows a close-up view of some of the tools of the tool set of FIG. 1.
Figure 4:
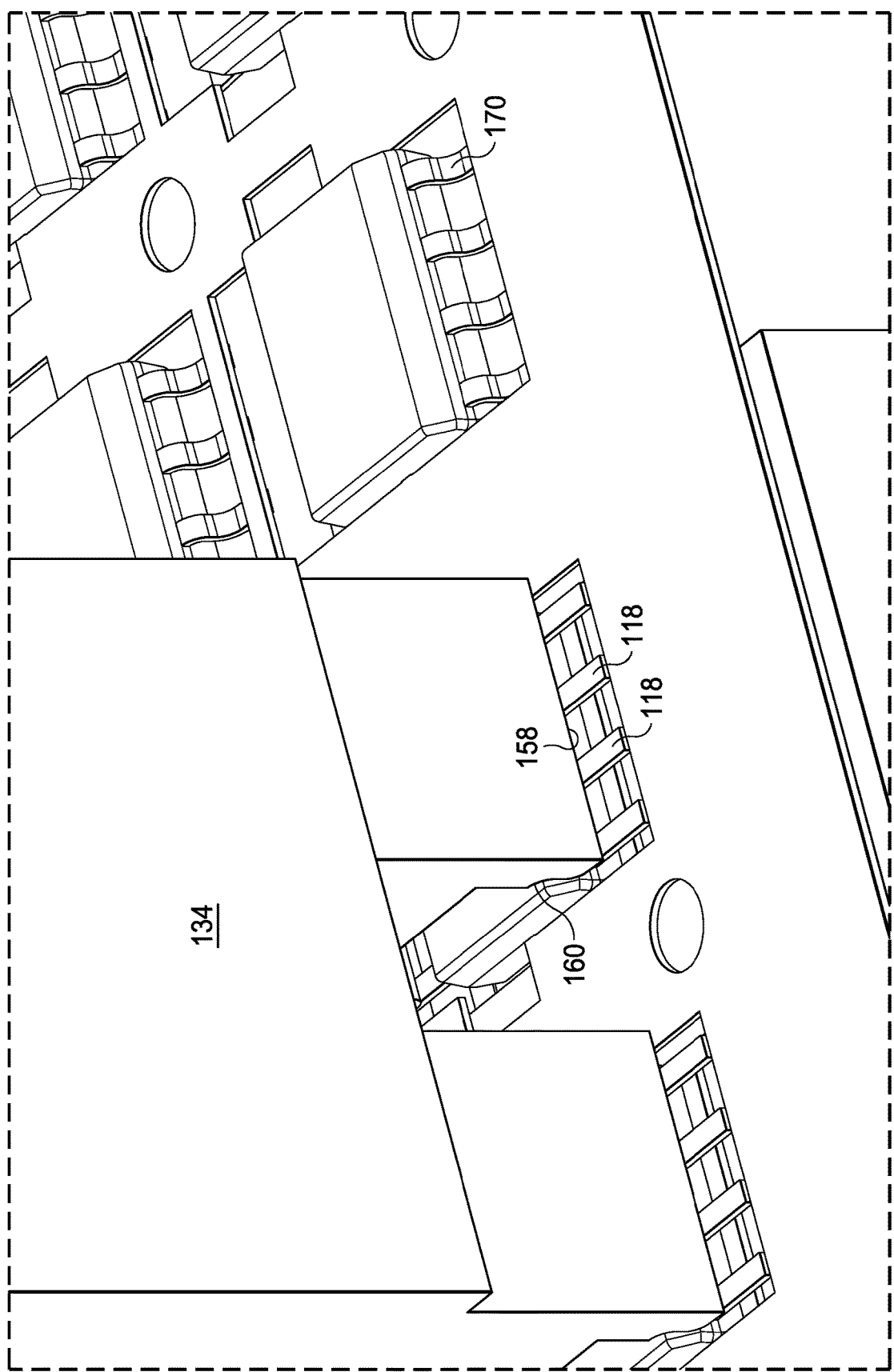
FIG. 4 shows another close-up view of some of the tools of the tool set of FIG. 1.

FIGS. 3 and 4 show close-up views of the distal ends of the tools 130, 132, and 134 used to punch and bend the leads 118. Tool 130 has a solid cutting edge 140 that is used to cut the distal ends 142 of the leads from the leadframe assembly as best shown in FIGS. 2 and 3. Tool 132 punches the dam bars 150 between neighboring leads. Upon the leads being separated using tools 130 and 132, tool 134 then bends the leads 102 into the desired shape, as best shown in FIG. 4. The distal end 158 of tool 134 has a curved shape 160 that, when tool 134 is pressed downward onto leads 102, bends the leads into a corresponding shape, as shown at 170.

Tools 130, 132, and 134 in FIG. 1 have long axes 131, 133, and 135, respectively. Tools 130, 132, and 134 are pressed downward over one or more rows 122 of dies 102 to punch and bend the leads of multiple dies 102 simultaneously. The tools 130, 132, and 134 are then moved (or the leadframe assembly 100 is moved) relative to the leadframe assembly 100 so that the tools can repeat the process on the next row(s) of dies.

The example leadframe assembly 100 in FIGS. 1-4 is specific to 8-pin dies. Different lead frames are available for use in 14-pin, 16-pin, etc. dies. The tools 130, 132, and 134 shown in FIG. 1 are collectively referred to as a "tool set" 139. Each lead frame for a given pin-count die uses a tool set 139 specific to that particular leadframe. That is, the tools 130, 132, and 134 shown in FIG. 1 for 8-pin dies will not work for a lead frame containing 14- or 20-pin dies. Instead, the tool set 139 will need to be changed out if a different pin-count die lead frame is to be used during production.

Figure 5:
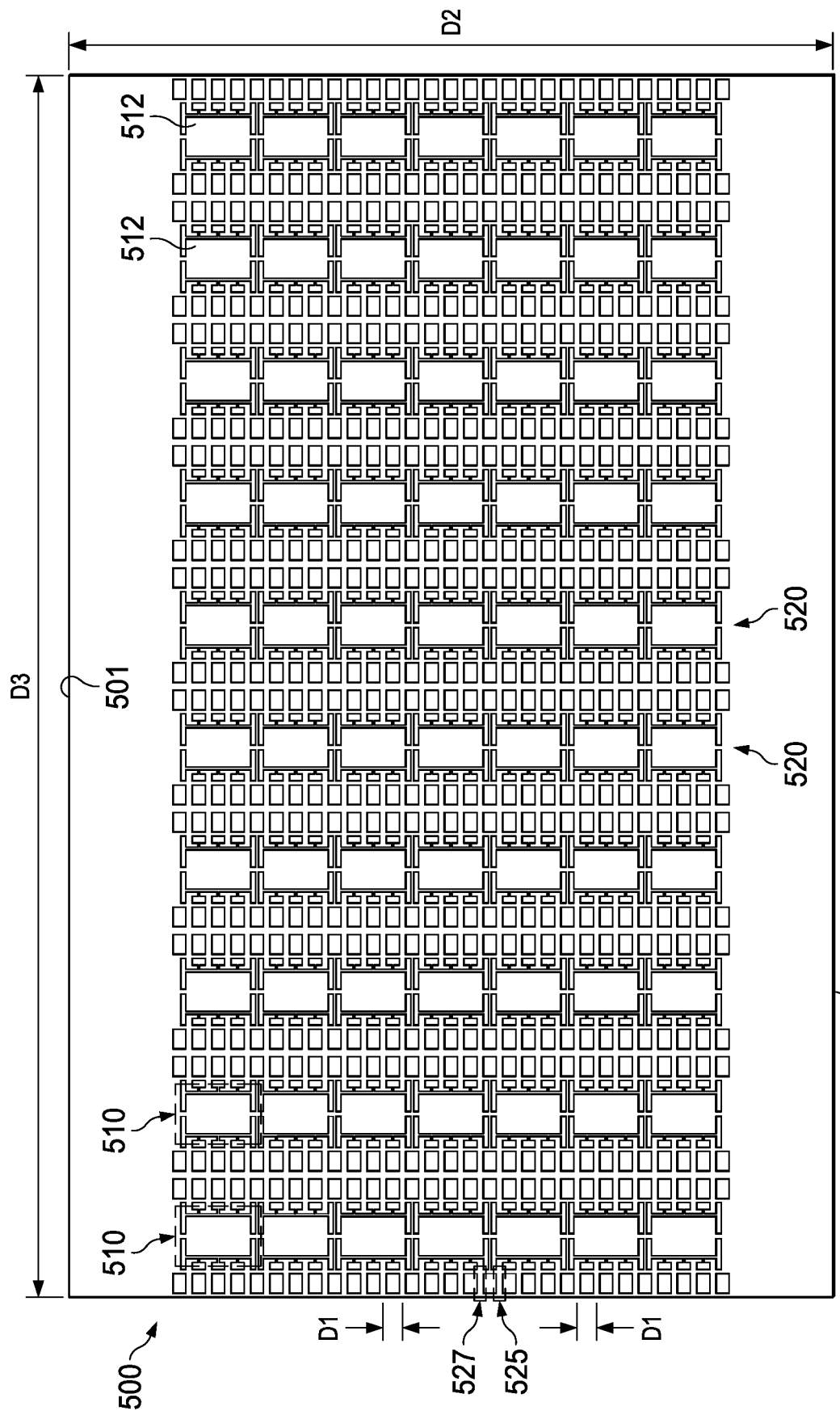
FIG. 5 shows another example of a leadframe accommodating 8-pin dies, but compatible for use with a universal tool set.

The examples described below address the problem of needing separate and unique tool sets 130 for each type of leadframe. FIG. 5 shows an example of a leadframe assembly 500. The leadframe assembly 500 may be formed by, for example, stamping a conductive plate into the configuration shown in FIG. 5. The leadframe assembly 500 includes opposing sides 501 and 502 with die attachment portions 510 extending from side 501 to side 502 in multiple, parallel rows 520 as shown. Die attach pads 512 are shown to which dies (not shown in FIG. 5) are then attached. The leadframe assembly 500 in this example accommodates 8-pin dies. The leadframe assembly 500 in this example is rectangular with a longer dimension D3 and a shorter dimension D2. The longitudinal axes of the dies within a given row 520 align orthogonal to longer sides 501 and 502. By contrast, the longitudinal axes 120 of the dies in FIG. 1 align parallel to the longer sides 114 and 116 of leadframe assembly 100. Further, the distance between adjacent leads (pitch) in FIG. 5 is shown as D1. The distance between an end lead of one die (e.g., lead 525) and the neighboring end lead of the next die in the same row 520 (e.g., lead 527) also is D1. As such, the spacing between adjacent leads within a given row 520 is constant (D1) between sides 501 and 502, even between leads of different dies. In the leadframe assembly example of FIGS. 1 and 2, while the spacing between leads of the same die is constant, the spacing between end leads of adjacent dies is different. By maintaining a constant inter-lead spacing along a given row 520 of die attachment portions 510, one common tool set can be used to punch the lead frame assembly and bend the leads regardless of the pin-count of the dies on the leadframe assembly. That is, different types of tool sets (for different pin-count dies) are not necessary. As such, tool sets need not be swapped out when production changes between, for example, 16-pin dies and 20-pin dies, as otherwise was the case for the example of FIGS. 1-4.

Figure 6:
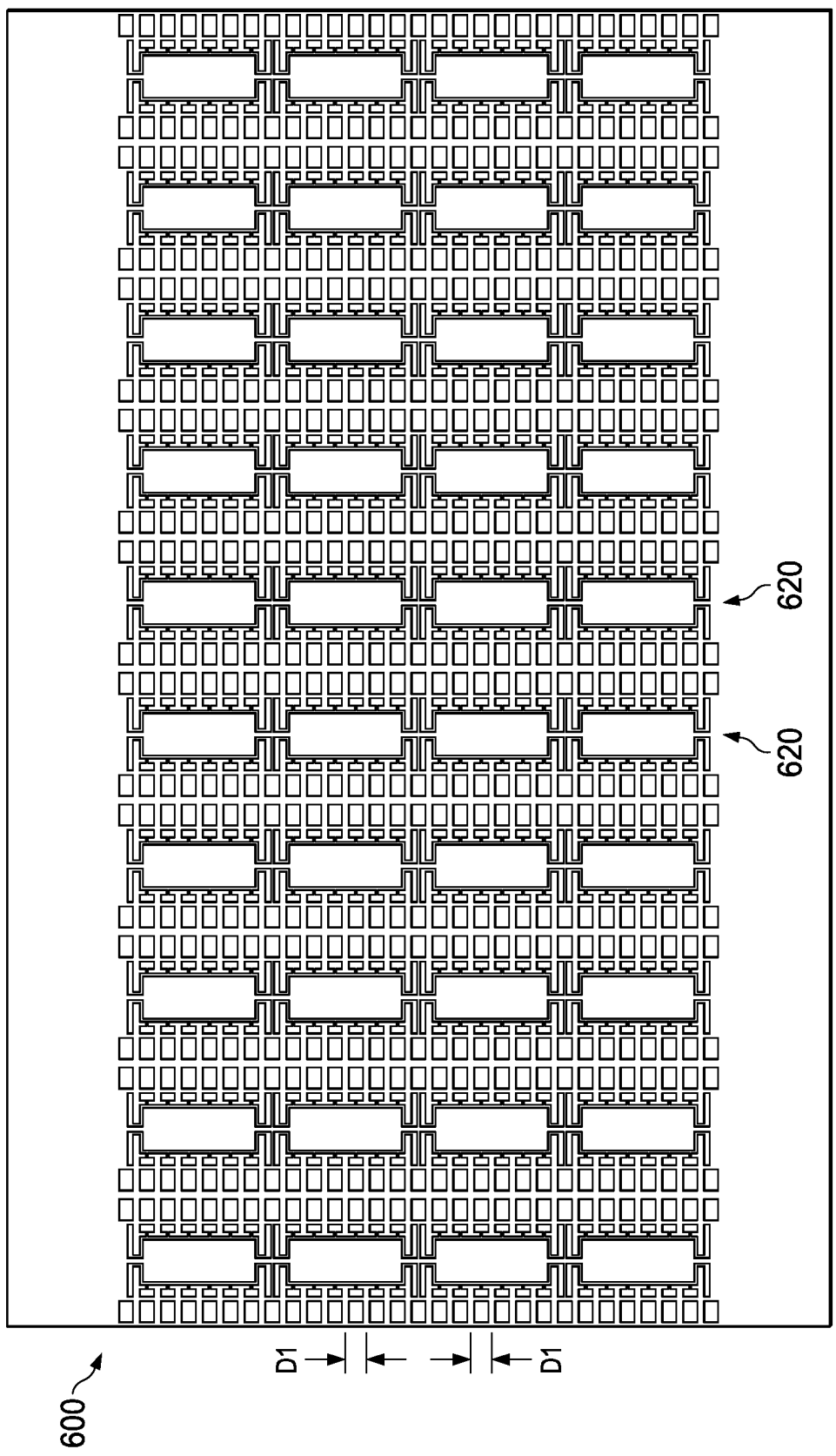
FIG. 6 shows an example of a leadframe accommodating 14-pin dies and also compatible for use with the universal tool set.

FIG. 6 shows an example of leadframe assembly 500 for use with 14-pin dies. As was the case for lead frame assembly 500 assembly of FIG. 5, the spacing between adjacent leads within a given row 620 of dies is constant (D1), even between leads of adjacent dies within a given row. Advantageously, the same tool set is used to form the leads for both leadframe assemblies 500 and 600.

Figure 7:
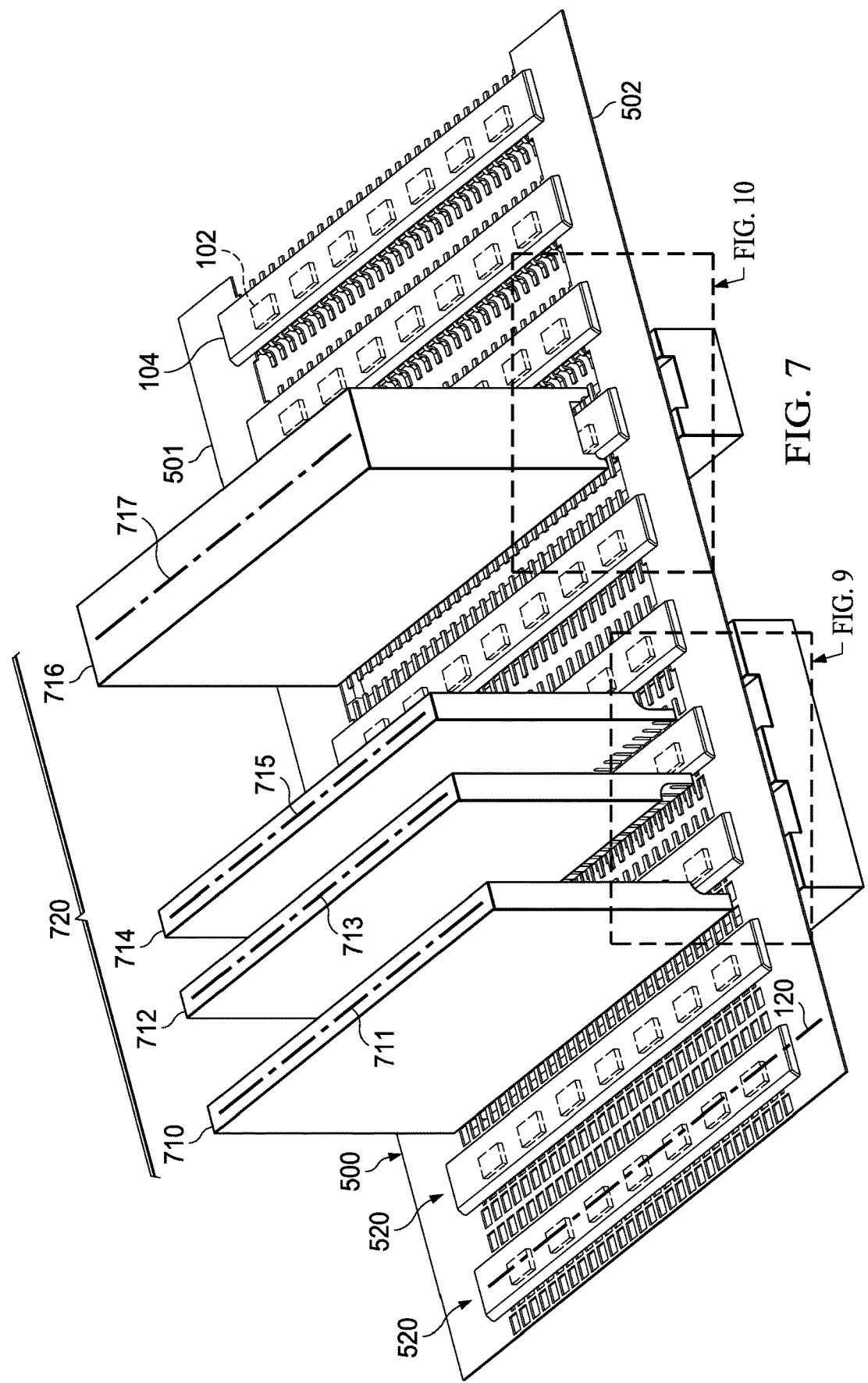
FIGS. 7 and 8 illustrate an example of the universal tool set usable with the leadframe assemblies of FIGS. 5 and 6.
Figure 8:
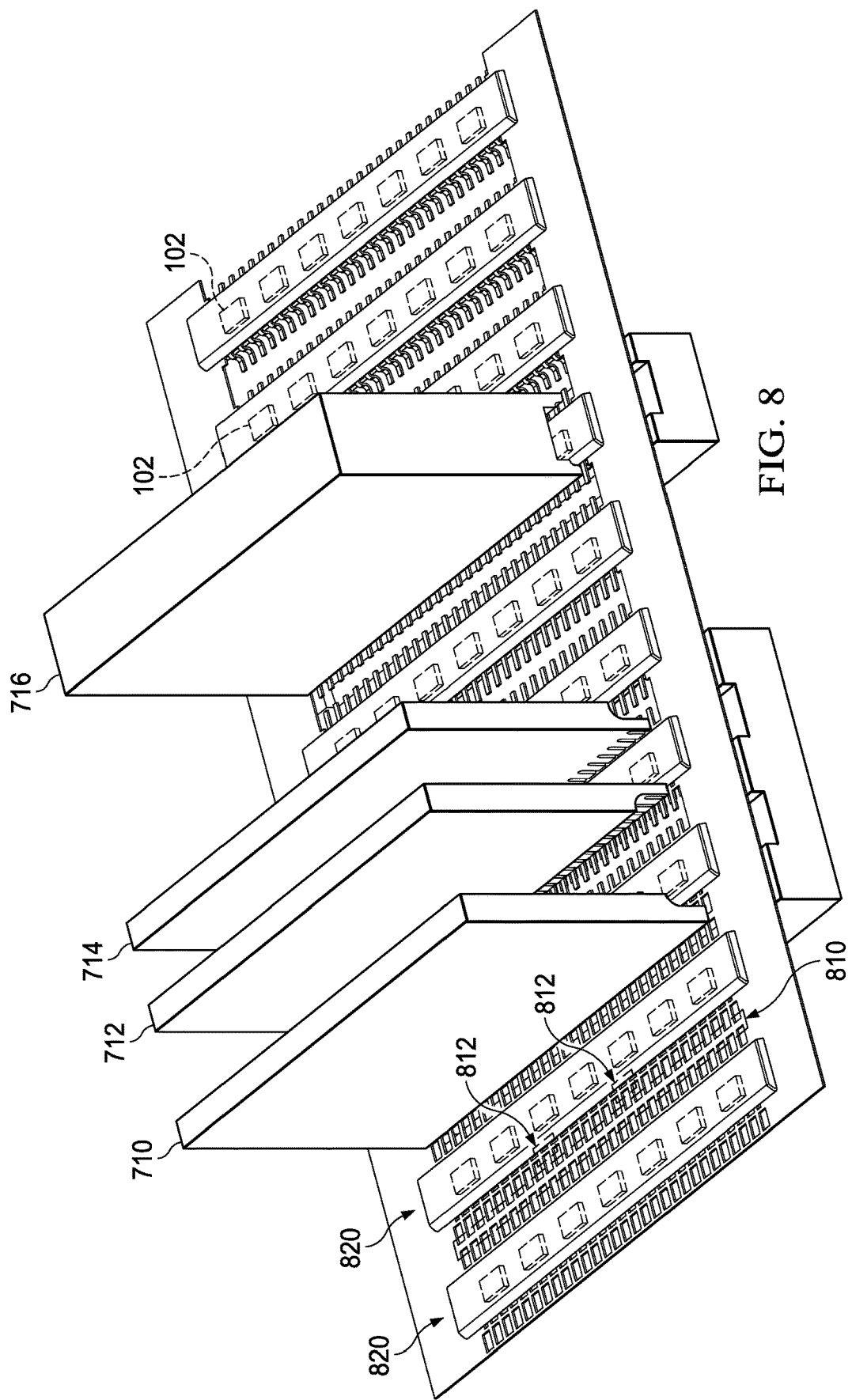

FIGS. 7-10 illustrate leadframe assembly 500 populated with dies 102 and mold compound 104. The mold compound 104 may be formed by, for example, loading molding pellets into a dispenser and then liquefying the pellets (e.g. using heat) to form a liquified molding compound to then cover the semiconductor dies without covering the entire leadframe assembly 500. The liquified molding compound may then be cured. FIGS. 7 and 8 illustrate tools 710, 712, 714, and 716 (collectively, tool set 720). Each tool 710, 712, 714, and 716 generally extend between longer sides 501 and 502 and has a longitudinal axis 711, 713, 715, and 717, respectively, in the same direction as the longitudinal axes 120 of the dies 102. By contrast, the long axes 131, 133, and 135 of tool set 130 in FIG. 1 are orthogonal to the longitudinal axes 120 of the dies 102 on the leadframe 100. In the example of FIGS. 5-10, because the spacing between leads is uniform between the longer sides 501, 502 of the leadframe assembly 500, the tool set 720 is agnostic to the number of pins of the dies 102 on the leadframe assembly. Thus, a common tool set 720 can be used regardless of the pin-count of the underlying dies 102.

Figure 9:
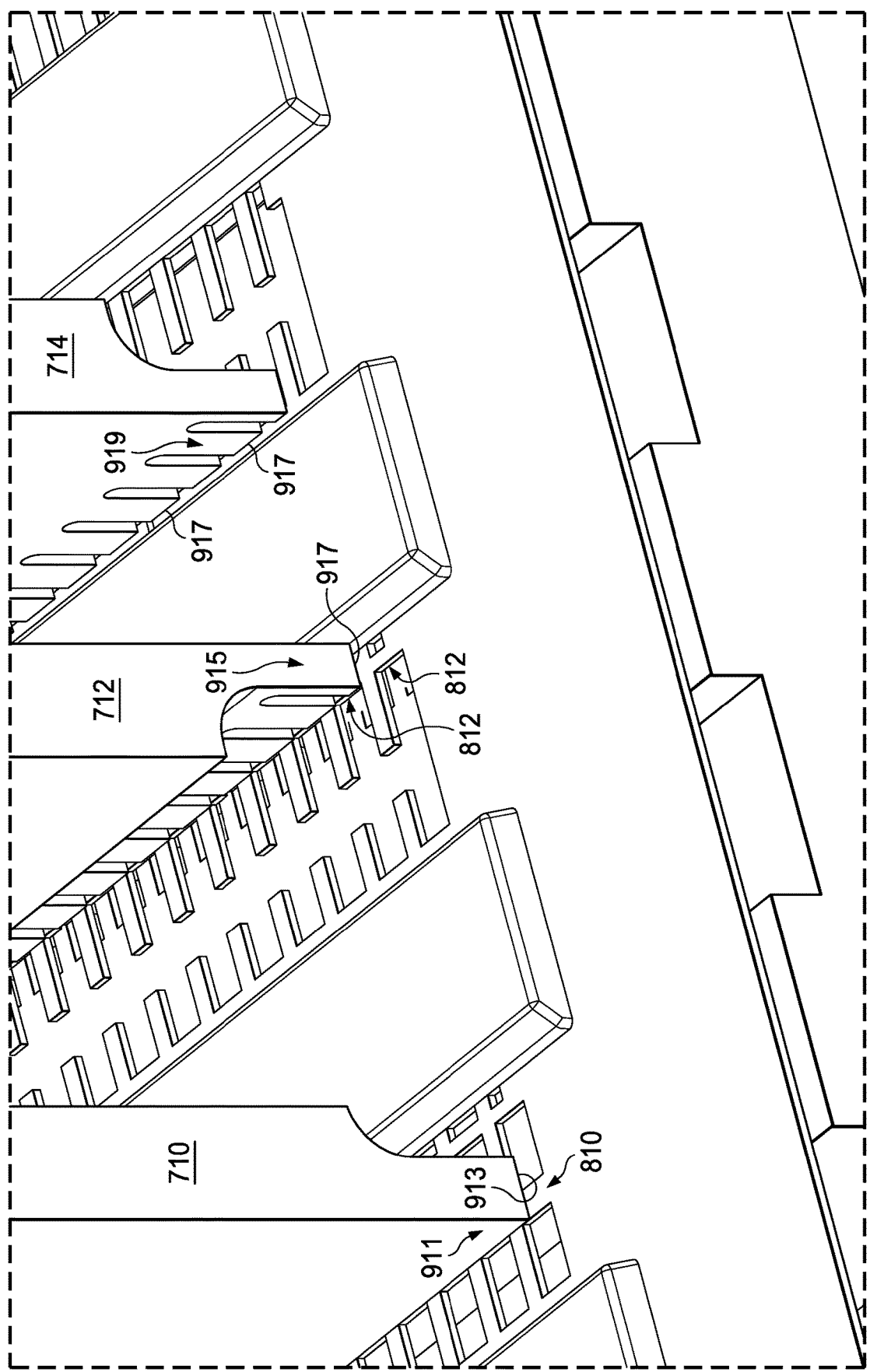
FIGS. 9 and 10 show close-up views of portions of the example universal tool set.
Figure 10:
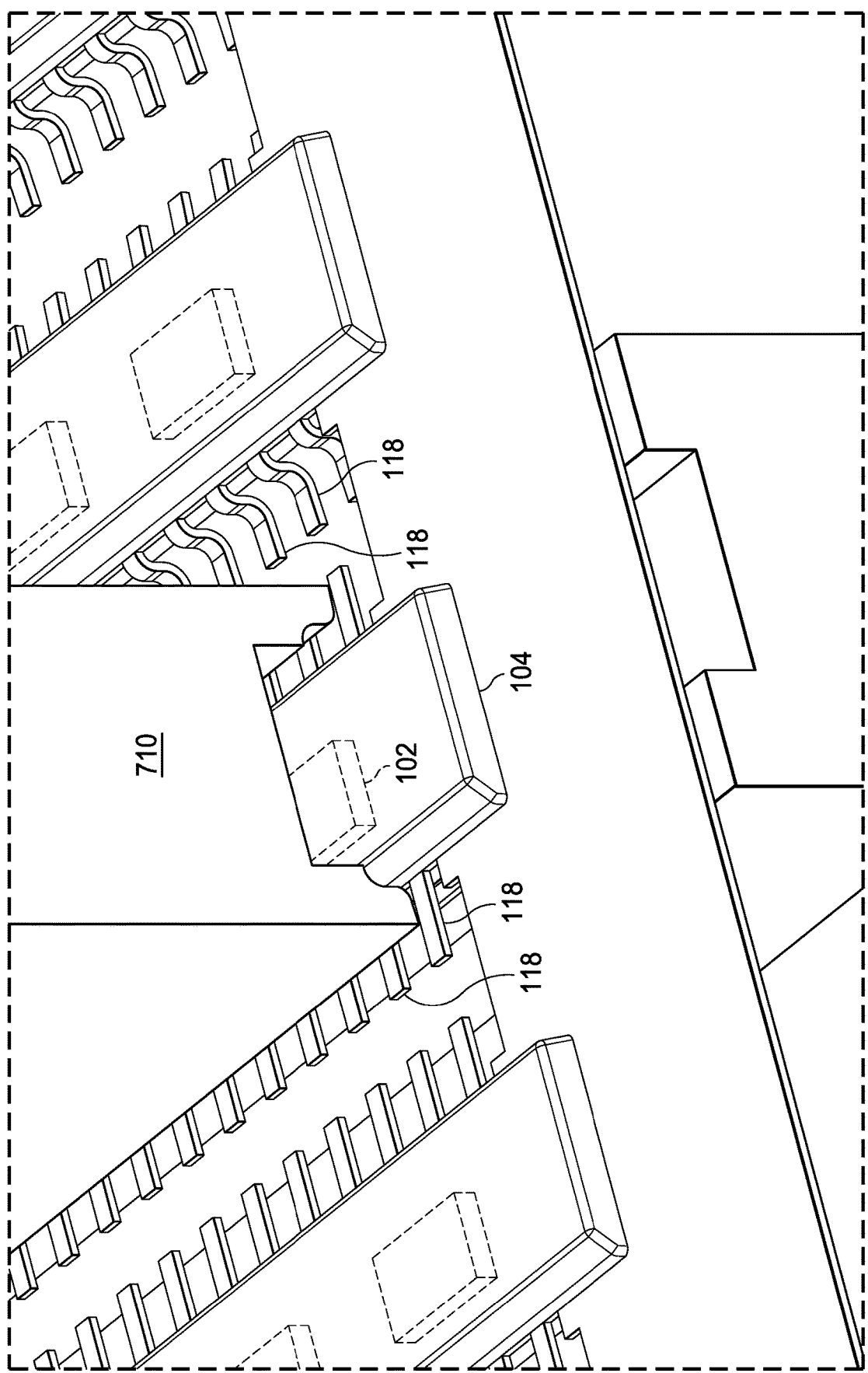

FIG. 9 illustrates that tool 710 has a distal end 911 with a solid punch surface 913 that is used to punch through the connecting members 810 connecting leads of adjacent rows 820 of dies 102. Tools 712 and 714 are mirror images of each other, and have respective distal ends 915 and 919 that punch through the dam bars 812. The distal ends 915 and 919 have punch surfaces 917 spaced apart so as not to punch through the leads of the individual dies 102. FIG. 10 shows a close-up view of tool 716 that is used to bend the leads 118 into the desired shape.

Figure 11:
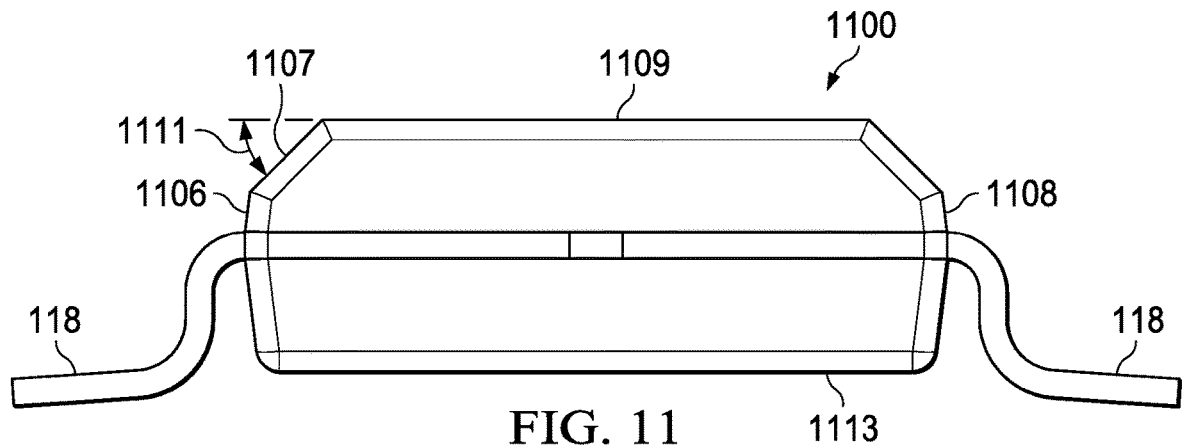
FIGS. 11 and 12 illustrate an example of completed semiconductor package made using the leadframe and tool set of FIG. 1.
Figure 12:
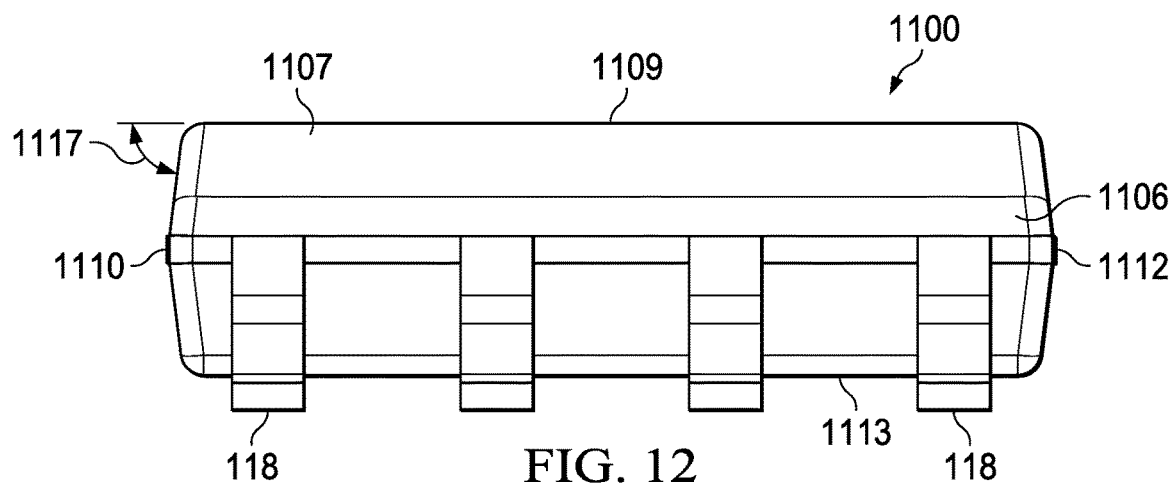

FIGS. 11 and 12 illustrate a single semiconductor package (chip) 1100 made using leadframe assembly 100 of FIG. 1. FIG. 11 shows a view of the package 1100 with leads 118 projecting out from sides 1106 and 1108. Each of sides 1106 and 1108 has angles to them as shown due to the flow of mold compound around the die. The angle 1111 between top surface 1109 and an upper portion of 1107 of side 1106 is less than 90 degrees (e.g., 45 degrees). FIG. 12 shows a view of package 1100 facing side 1106 thereby illustrating the geometry of sides 1110 and 1112. The angle 1117 formed between the plane of top surface 1109 and side 1110 also is less than 90 degrees. FIGS. 11 and 12 illustrate that the angle between the top surface 1109 (and bottom surface 1113) and each of the four sides 1106, 1108, 1110, and 1112 is less than 90 degrees. Because sufficient spacing exists between adjacent dies on leadframe assembly 100, the packages need not be sawed during the process of singulating the finished packages from the leadframe assembly 100.

Figure 13:
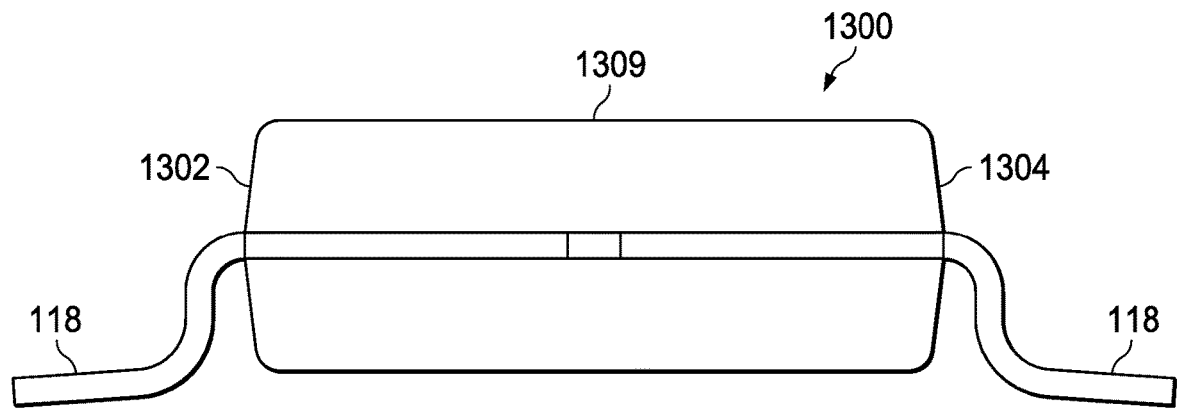
FIGS. 13 and 14 illustrate an example of completed semiconductor package made using the leadframe and tool set of FIG. 7.
Figure 14:
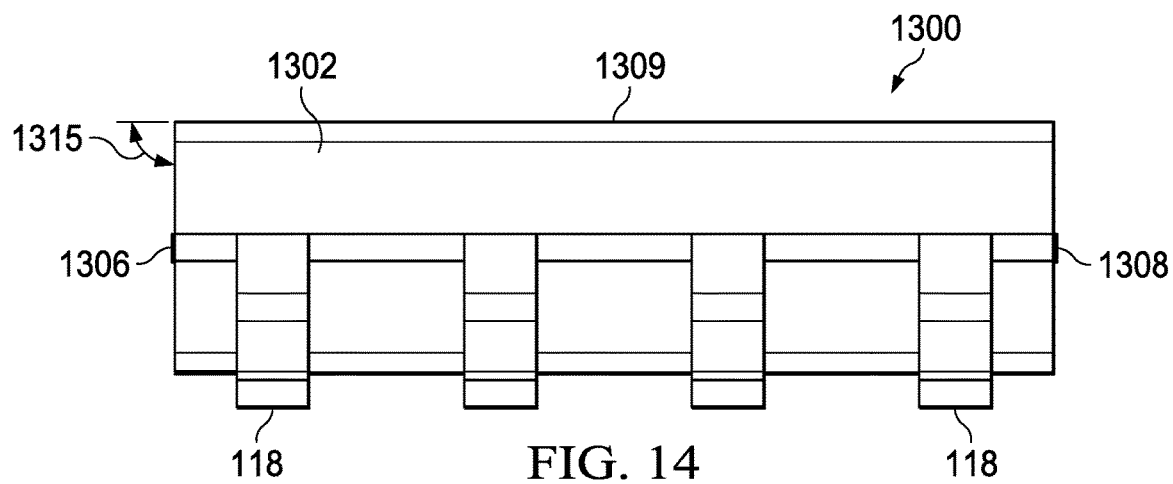

FIGS. 13 and 14 illustrate a single semiconductor package 1300 made using leadframe assembly 500 of FIG. 5. FIG. 13 shows a view of package 1300 with leads 118 projecting out from sides 1302 and 1304. The angles between the top surface 1309 and the sides 1302 and 1304 are similar to that shown in FIG. 11. FIG. 14 shows the orthogonal view facing side 1302. As can be seen in this view, the angle 1315 between top surface 1309 and side surfaces 1306 and 1308 is 90 degrees. Because the dies are placed much closer together along each row 520 (FIG. 7), the mold compound itself is sawed during the singulation process to separate dies 102 within each row 520.

Modifications are possible in the described embodiments, and other embodiments are possible, within the scope of the claims.

What is claimed is:

1. A method of manufacturing a semiconductor package, the method comprising:

forming a leadframe assembly to have a pair of opposing sides, and having semiconductor die attachment portions extending between the opposing sides;

placing semiconductor dies on the leadframe assembly in the die attachment portions, each die has a plurality of leads on each of two opposing sides of the die and a longitudinal axis parallel to each plurality of leads, the longitudinal axis of each die orthogonal to the opposing sides of the leadframe assembly;

applying mold compound to the semiconductor dies without covering the entire leadframe assembly; and punching through the leadframe assembly between the opposing sides using a first tool having a first tool longitudinal axis parallel to longitudinal axes of the dies.

2. The method of claim 1, further comprising punching through dam bars between adjacent leads of the leadframe assembly using a second tool having a second tool longitudinal axis parallel to the longitudinal axes of the dies.

3. The method of claim 1, bending the leads of the dies using a third tool having a third tool longitudinal axis parallel to the longitudinal axes of the dies.

4. The method of claim 1, wherein forming the leadframe assembly comprises stamping a conductive plate.

5. The method of claim 1, wherein placing the semiconductor dies comprises picking and placing the semiconductor dies on the die attachment portions.

6. The method of claim 1, wherein applying mold compound comprises loading molding pellets into a dispenser, flowing the pellets to form a liquified molding compound, and curing the liquified molding compound.

7. A semiconductor package, comprising:
a semiconductor die and leads on opposing sides of the semiconductor die; and
mold compound covering the semiconductor die, the mold compound having a top surface, a first pair of sides from which the leads extend, and a second pair of sides orthogonal to the first pair of side, an angle between the top surface and the second pair of side is less than 90 degrees, and an angle between the top surface and the second pair of sides is 90 degrees.

8. The semiconductor package of claim 7, wherein the semiconductor die is on and attached to a portion of a leadframe.

9. The semiconductor package of claim 8, wherein the leadframe includes the leads on opposing sides of the semiconductor die.

* * * * *

UNITED STATES PATENT AND TRADEMARK OFFICE
CERTIFICATE OF CORRECTION

PATENT NO.         : 11,626,350 B2
APPLICATION NO.    : 16/839216
DATED              : April 11, 2023
INVENTOR(S)        : Chong Han Lim et al.

Page 1 of 1

It is certified that error appears in the above-identified patent and that said Letters Patent is hereby corrected as shown below:

In the Specification

Column 2, Line 5: Please change "second pair of side" to be "first pair of sides".

In the Claims

Column 6, Line 15, Claim 7, Line 8: Please change "second pair of side" to be "first pair of sides".

Signed and Sealed this
Fourteenth Day of November, 2023

*Katherine Kelly Vidal*

Katherine Kelly Vidal
*Director of the United States Patent and Trademark Office*